US012765131B2

(12) United States Patent
Guo et al.

(10) Patent No.: US 12,765,131 B2

(45) Date of Patent: Oct. 13, 2026

(54) ULED LIGHT-EMITTING AND DISPLAY DEVICE WITHOUT ELECTRICAL CONTACT, EXTERNAL CARRIER INJECTION AND MASS TRANSFER AND PREPARATION METHOD THEREOF

(71) Applicants: FUZHOU UNIVERSITY, Fuzhou (CN); MINDU INNOVATION LAB, Fuzhou (CN)

(72) Inventors: Tailiang Guo, Fuzhou (CN); Kun Wang, Fuzhou (CN); Chaoxing Wu, Fuzhou (CN); Dianlun Li, Fuzhou (CN); Yongai Zhang, Fuzhou (CN); Xiongtu Zhou, Fuzhou (CN); Ye Liu, Fuzhou (CN)

(73) Assignees: FUZHOU UNIVERSITY, Fujian (CN); MINDU INNOVATION LAB, Fujian (CN)

( * ) Notice: Subject to any disclaimer, the term of this patent is extended or adjusted under 35 U.S.C. 154(b) by 1214 days.

(21) Appl. No.: 17/768,509

(22) PCT Filed: Aug. 31, 2020

(86) PCT No.: PCT/CN2020/112401

§ 371 (c)(1),
(2) Date: Apr. 13, 2022

(87) PCT Pub. No.: WO2021/073287

PCT Pub. Date: Apr. 22, 2021

(65) Prior Publication Data

US 2024/0097078 A1 Mar. 21, 2024

(30) Foreign Application Priority Data

Oct. 16, 2019 (CN) ........................ 201910984750.X

(51) Int. Cl.
*H10H 20/85* (2025.01)
*H10H 20/01* (2025.01)
(Continued)

(52) U.S. Cl.
CPC ...... *H10H 20/8506* (2025.01); *H10H 20/018* (2025.01); *H10H 20/0363* (2025.01);
(Continued)

(58) Field of Classification Search
CPC .............. H01L 25/167; H01L 25/0753; H10H 20/0363; H10H 29/142; H10H 20/857; H10H 20/032; H10H 20/0364
(Continued)

(56) References Cited

U.S. PATENT DOCUMENTS

2012/0169786 A1* 7/2012 Okuyama ............ H10H 20/853 362/249.02
2012/0320581 A1* 12/2012 Rogers .................... H01L 24/82 257/E33.059

(Continued)

OTHER PUBLICATIONS

Perumal et al. "Novel Approach for Alternating Current (AC)-Driven Organic Light-Emitting Devices" Nov. 7, 2011. Advanced Functional Materials (www.afm-journal.de). pp. 210-217. (Year: 2012).*

*Primary Examiner* — Ratisha Mehta
*Assistant Examiner* — Mikka Liu
(74) *Attorney, Agent, or Firm* — Jose Cherson Weissbrot

(57) ABSTRACT

The present invention relates to a μLED light-emitting and display device without electrical contact, external carrier injection and mass transfer and a preparation method thereof. The μLED light-emitting and display device includes one or more light-emitting pixels, and each light-emitting pixel includes a pixel lower electrode, a lower insulation layer, a μLED chip, an upper insulation layer and a pixel upper electrode from bottom to top, wherein the
(Continued)

upper insulation layer and the lower insulation layer prevent the μLED chip from being in direct electrical contact with the pixel lower electrode and the pixel upper electrode, and the μLED chip is lit by an alternating electric field through electromagnetic coupling. In the present invention, the μLED chip is not in electrical contact with a driving electrode, such that a structure of the μLED chip may be simplified, a μLED chip array may be disposed in a manner such as ink-jet printing, screen printing, spin coating, brush coating, roll coating or chemical self-assembly, the use of a mass transfer process and a complex bonding process of the μLED chip and a driving array may be avoided, a manufacturing period of the μLED device is effectively shortened and manufacturing costs are reduced, and it is expected to enhance the market competitiveness of the μLED.

7 Claims, 4 Drawing Sheets

(51) Int. Cl.
*H10H 20/81* (2025.01)
*H10H 20/811* (2025.01)
*H10H 20/855* (2025.01)
*H10H 20/857* (2025.01)
*H10W 90/00* (2026.01)

(52) U.S. Cl.
CPC .......... *H10H 20/81* (2025.01); *H10H 20/811* (2025.01); *H10H 20/855* (2025.01); *H10H 20/857* (2025.01); *H10W 90/00* (2026.01); *H10H 20/032* (2025.01); *H10H 20/0364* (2025.01)

(58) Field of Classification Search
USPC ...................................................... 257/88–89
See application file for complete search history.

(56) References Cited

U.S. PATENT DOCUMENTS

| | | | | |
|---|---|---|---|---|
| 2018/0151773 | A1* | 5/2018 | Sekiya | H01L 25/0753 |
| 2018/0158847 | A1* | 6/2018 | Chang | G09G 3/32 |
| 2020/0203419 | A1* | 6/2020 | Andrews | H10H 20/01335 |
| 2020/0395403 | A1* | 12/2020 | Ahmed | G09F 9/33 |

* cited by examiner

ULED LIGHT-EMITTING AND DISPLAY DEVICE WITHOUT ELECTRICAL CONTACT, EXTERNAL CARRIER INJECTION AND MASS TRANSFER AND PREPARATION METHOD THEREOF

CROSS REFERENCE TO RELATED APPLICATIONS

This application is the national phase entry of International Application No. PCT/CN2020/112401, filed on Aug. 31, 2020, which is based upon and claims priority to Chinese Application No. CN201910984750.X. filed on Oct. 16, 2019 the entire contents of which are incorporated herein by reference.

BACKGROUND OF THE INVENTION

1. Technical Field

The present invention relates to the field of light-emitting and display device design, and in particular to a μLED light-emitting and display device without electrical contact, external carrier injection and mass transfer and a preparation method thereof.

2. Description of Related Art

In the field of panel display technologies, micro light emitting diodes (μLED) have many advantages, most notably, such as low power consumption, high luminance, ultra-high definition, high color saturation, faster response, longer service life, and higher operation efficiency. The μLED is a reformed novel display technology that is expected to replace almost all other applications of TFT liquid crystal displays in the field of panel display.

At present, the traditional method for manufacturing an LED is continued as a production process of the μLED, which includes: growing a PN junction on a basic surface by various methods for growing a thin film, and then cutting the PN junction into micron-scale LED chips, and transferring the chips with different light-emitting colors to a circuit substrate by use of various mechanical tools to realize accurate electrical contact between the μLED chip and a driving electrode through accurate alignment and bonding. Such a process consumes a large amount of time and is low in efficiency since a huge number of μLED chips need to be picked up, placed and bonded. In addition, the traditional μLED chip is manufactured with an N contact electrode and a P contact electrode to realize the injection of external carriers. However, direct contact resistance between the electrode and a semiconductor layer of the μLED chip may increase a threshold voltage of the device and generates Joule heat during operation. To solve the above problems and improve the efficiency of the μLED industry, it is urgent to develop and design a new μLED.

BRIEF SUMMARY OF THE INVENTION

In view of this, an object of the present invention is to provide a y LED light-emitting and display device without electrical contact, external carrier injection and mass transfer and a preparation method thereof, which can avoid the use of a mass transfer process and a complex bonding process of a μLED chip and a driving array, and effectively shorten a manufacturing period of the μLED device and reduce manufacturing costs, and are expected to enhance the market competitiveness of the μLED.

The present invention is realized through the following technical solution. A μLED light-emitting and display device without electrical contact, external carrier injection and mass transfer includes one or more light-emitting pixels, and each light-emitting pixel includes a pixel lower electrode, a lower insulation layer, a μLED chip, an upper insulation layer and a pixel upper electrode from bottom to top, wherein the upper insulation layer and the lower insulation layer can prevent the μLED chip from being in direct electrical contact with the pixel lower electrode and the pixel upper electrode, and the μLED chip is lit by an alternating electric field through electromagnetic coupling. An intensity and polarity of the alternating electric field changes over time, wherein the pixel lower electrode and the pixel upper electrode include a connection line attached thereto and a driving module.

There is no direct electrical contact between the pixel electrode and the μLED chip, and the alternating electric field drives periodic oscillation of an electron-hole pair inside the μLED through electromagnetic coupling to form radiative recombination luminescence.

Further, the μLED chip includes a P-type semiconductor layer, a light emitting layer (multi-quantum well) and an N-type semiconductor layer that are stacked to form a semiconductor junction that can emit light under the action of the electric field.

Further, the semiconductor junction in the μLED chip includes but is not limited to a single PN junction, a single heterojunction, a composite PN junction including a plurality of PN junctions or a combined semiconductor junction including a PN junction and a heterojunction.

Further, the semiconductor junction is located on a surface or in an interior of the μLED chip.

Further, a thickness of the P-type semiconductor layer ranges from 1 nm to 2.0 μm, a thickness of the light emitting layer ranges from 1 nm to 1.0 μm, and a thickness of the N-type semiconductor layer ranges from 1 nm to 2.5 μm.

Further, a size of the μLED chip ranges from 1 nm to 1000 μm, and a thickness of the μLED chip ranges from 1 nm to 100 μm.

Further, the μLED chip emits light in different colors including infrared light or ultraviolet light by selecting different semiconductor materials.

Further, the μLED chip can emit light in the same color or in different mixed colors by adopting the composite PN junction or the combined semiconductor junction.

Further, there are one or more μLED chips in each pixel. When there are more than one μLED chips, all μLED chips are located on the same horizontal plane, and neither of sizes of the pixel upper electrode and the pixel lower electrode in one pixel is less than a sum of sizes of all μLED chips in the pixel.

Further, at least one of the pixel upper electrode and the pixel lower electrode is a transparent electrode, such that the device may be transparent at both sides, or may be transparent at one side and non-transparent at the other side.

A material of the transparent electrode includes but is not limited to graphene, indium tin oxide, a carbon nanotube, a silver nanowire, a copper nanowire or a combination thereof; a material of a non-transparent electrode includes but is not limited to gold, silver, aluminum, copper or a combination thereof.

Further, light transmittance of the upper insulation layer or the lower insulation layer in a visible light range is greater than or equal to 80%, and a material thereof includes an organic insulation material, an inorganic insulation material, air or a combination thereof.

Further, thicknesses of the upper insulation layer and the lower insulation layer both range from 1 nm to 1000 μm.

Further, the upper insulation layer and the lower insulation layer are both deposited on a surface of the μLED chip. Optionally, the upper insulation layer and the lower insulation layer are deposited on surfaces of the pixel upper electrode and the pixel lower electrode respectively.

Further, a voltage waveform of the alternating electric field includes but is not limited to a sine wave, a triangle wave, a square wave, a pulse or a combination thereof. A voltage frequency of the alternating electric field ranges from 1 Hz to 1000M Hz.

Further, the μLED light-emitting and display device is manufactured on a rigid material including glass or ceramics, or manufactured on a flexible material including PI.

The present invention further provides a method for preparing the PLED light-emitting and display device without electrical contact, external carrier injection and mass transfer as described above. Specifically, the method includes the following steps.

In S1, a self-supporting μLED chip is obtained by growing an LED thin film structure that can generate a light source in three primary colors, i.e., red, green and blue on a surface of a semiconductor substrate and forming a μLED chip pattern with a desired size by cutting and peeling.

In S2, a lower electrode array of a sub-pixel having three primary colors, i.e., red, green and blue, a thin film transistor driving array, and an electrical connection line therebetween are prepared on the surface of the substrate according to size and definition requirements of a display.

In S3, non-electrical contact between the μLED chip and a corresponding sub-pixel lower electrode is realized through an insulation layer preparation process by disposing red, green and blue μLED chips on a surface of the lower electrode of the sub-pixel having three primary colors, i.e., red, green and blue correspondingly and respectively.

In S4, non-electrical contact between the μLED chip and a corresponding sub-pixel upper electrode is realized through the insulation layer preparation process by disposing a pixel upper electrode and an electrical connection line thereof on the surface of the substrate provided with red, green and blue μLED chips, so as to obtain a μLED light-emitting and display device without electrical contact, external carrier injection and mass transfer.

The operation of the μLED device is realized by applying an AC driving signal on the pixel upper electrode and the thin film transistor array.

Further, the substrate is a rigid material including glass or ceramics, or a flexible material including P1.

Further, in S3, the red, green and blue μLED chips are disposed at desired positions respectively in a manner of ink-jet printing, screen printing, spin coating, brush coating, roll coating, chemical self-assembly, or electromagnetic self-assembly.

Further, in S3, realizing the non-electrical contact between the μLED chip and the corresponding sub-pixel lower electrode through the insulation layer preparation process specifically includes: realizing the non-electrical contact between the μLED chip and a pixel lower electrode by firstly preparing an insulation layer on a surface of a pixel lower electrode array, and then disposing the μLED chip on a surface of the insulation layer.

Optionally, in S3, realizing the non-electrical contact between the μLED chip and the corresponding sub-pixel lower electrode through the insulation layer preparation process specifically includes: realizing the non-electrical contact between the μLED chip and a pixel lower electrode by wrapping an insulation layer on a surface of the μLED chip, and then preparing the μLED chip wrapped with the insulation layer on a surface of the pixel lower electrode.

Further, in S4, the pixel upper electrode and the electrical connection line thereof are prepared by lamination or growth.

Further, in S4, realizing the non-electrical contact between the μLED chip and the corresponding sub-pixel upper electrode through the insulation layer preparation process specifically includes: realizing the non-electrical contact between the PLED chip and the pixel upper electrode by firstly depositing an insulation layer on a surface of the μLED chip, and then preparing the pixel upper electrode on a surface of the insulation layer.

Optionally, in S4, realizing the non-electrical contact between the μLED chip and the corresponding sub-pixel upper electrode through the insulation layer preparation process specifically includes: realizing the non-electrical contact between the μLED chip and the pixel upper electrode by firstly preparing an insulation layer on a surface of the pixel upper electrode, and then manufacturing the upper electrode and the insulation layer on a surface of the μLED chip through a lamination technology.

Compared to the prior art, the present invention achieves the following beneficial effects. In the present invention, there is no direct electrical contact between the μLED chip and the external driving electrode, and no external carrier is injected into the μLED chip, such that a structure of the μLED chip may be simplified, a μLED chip array may be disposed in a manner such as ink-jet printing, screen printing, spin coating, brush coating, roll coating or chemical self-assembly, the use of a mass transfer process and a complex bonding process of the PLED chip and the driving array can be avoided, and a manufacturing period of the μLED device is effectively shortened and manufacturing costs are reduced, thereby enhancing the market competitiveness of the PLED.

BRIEF DESCRIPTION OF THE SEVERAL VIEWS OF THE DRAWINGS

FIG. 5 is a schematic diagram of a lower substrate.

FIG. 6 is a schematic diagram of a lower substrate on which a PLED is prepared.

FIG. 7 is a schematic diagram of a μLED light-emitting and display device.

Figure 1:
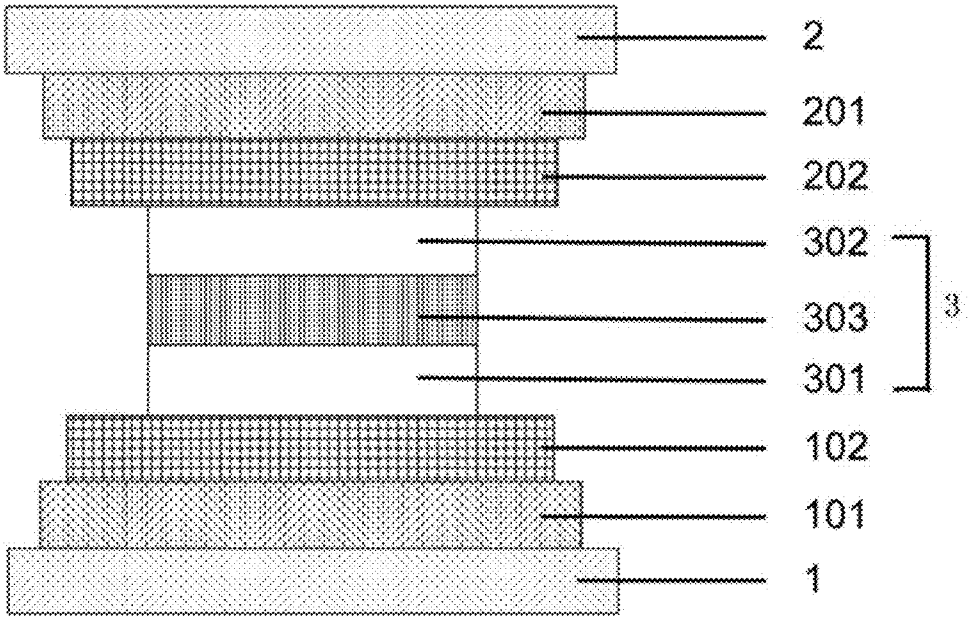
FIG. 1 is a sectional view of a light-emitting pixel in a μLED light-emitting and display device without electrical contact, external carrier injection and mass transfer according to an embodiment of the present invention.

Numerals in the drawings are described as follows: 1 represents to a lower substrate, 101 represents a pixel lower electrode disposed on a surface of the lower substrate, 102 represents a lower insulation layer, 103 represents a thin film transistor driving array disposed on the surface of the lower substrate, 104 represents an electrode connection line disposed on the surface of the lower substrate, 2 represents an upper substrate, 201 represents a pixel upper electrode disposed on a surface of the upper substrate and an electrode connection line, 202 represents an upper insulation layer, 3 represents a μLED chip, 301 represents a P-type semiconductor layer, 302 represents an N-type semiconductor layer, 303 and 304 both represent a light emitting layer, and 305 represents a P-type semiconductor layer.

DETAILED DESCRIPTION OF THE INVENTION

The present invention will be further described below in combination with accompanying drawings and embodiments.

It should be noted that, the following detailed descriptions are all exemplary, and are intended to provide further explanation of the present invention. All technical and scientific terms used herein have the same meaning as commonly understood by those of ordinary skills in the art, unless otherwise indicated.

It is to be noted that, the terms used herein are for the purpose of describing the specific embodiments only, and are not intended to limit the exemplary embodiments of the present invention. For example, singular forms used herein are also intended to include plural forms, unless otherwise clearly indicated in the context. In addition, it should also be understood that the terms "comprise" and/or "include" used in the present specification indicate the presence of features, steps, operations, devices, components and/or combinations thereof.

An embodiment of the present invention provides a μLED light-emitting and display device without electrical contact, external carrier injection and mass transfer. The μLED light-emitting and display device includes one or more light-emitting pixels, and each light-emitting pixel includes a pixel lower electrode, a lower insulation layer, a μLED chip, an upper insulation layer and a pixel upper electrode from bottom to top, wherein the upper insulation layer and the lower insulation layer can prevent the μLED chip from being in direct electrical contact with the pixel lower electrode and the pixel upper electrode, and the μLED chip is lit by an alternating electric field through electromagnetic coupling. An intensity and polarity of the alternating electric field changes over time, wherein the pixel lower electrode and the pixel upper electrode include a connection line attached thereto and a driving module.

In this embodiment, there is no direct contact between the pixel electrode and the μLED chip, and the μLED chip is lit by an AC driving signal through electrical coupling. An insulation material is filled between the μLED chip and the driving electrode, and the external alternating electric field drives periodic oscillation of an electron-hole pair inside the μLED to form radiative recombination in a light emitting region.

In this embodiment, the μLED chip includes a P-type semiconductor layer, a light emitting layer (multi-quantum well) and an N-type semiconductor layer that are stacked to form a semiconductor junction that can emit light under the action of the electric field.

In this embodiment, the semiconductor junction in the μLED chip includes but is not limited to a single PN junction, a single heterojunction, a composite PN junction including a plurality of PN junctions or a combined semiconductor junction including a PN junction and a heterojunction.

In this embodiment, the semiconductor junction is located on a surface or in an interior of the p. ED chip.

In this embodiment, a thickness of the P-type semiconductor layer ranges from 1 nm to 2.0 μm, a thickness of the light emitting layer ranges from 1 nm to 1.0 μm, and a thickness of the N-type semiconductor layer ranges from 1 nm to 2.5 μm.

In this embodiment, a size of the μLED chip ranges from 1 nm to 1000 μm, and a thickness of the μLED chip ranges from 1 nm to 100 μm.

In this embodiment, the μLED chip emits light in different colors including infrared light or ultraviolet light by selecting different semiconductor materials.

In this embodiment, the μLED chip can emit light in the same color or in different mixed colors by adopting the composite PN junction or the combined semiconductor junction.

In this embodiment, there are one or more μLED chips in each pixel. When there are more than one μLED chips, all μLED chips are located on the same horizontal plane, and neither of sizes of the pixel upper electrode and the pixel lower electrode in one pixel is less than a sum of sizes of all μLED chips in the pixel.

In this embodiment, at least one of the pixel upper electrode and the pixel lower electrode is a transparent electrode, such that the device may be transparent at both sides, or may be transparent at one side and non-transparent at the other side.

A material of the transparent electrode includes but is not limited to graphene, indium tin oxide, a carbon nanotube, a silver nanowire, a copper nanowire or a combination thereof; a material of a non-transparent electrode includes but is not limited to gold, silver, aluminum, copper or a combination thereof.

In this embodiment, light transmittance of the upper insulation layer or the lower insulation layer in a visible light range is greater than or equal to 80%, and a material thereof includes an organic insulation material, an inorganic insulation material, air or a combination thereof.

In this embodiment, thicknesses of the upper insulation layer and the lower insulation layer both range from 1 nm to 1000 μm.

In this embodiment, the upper insulation layer and the lower insulation layer are both deposited on the surface of the μLED chip. Optionally, the upper insulation layer and the lower insulation layer are deposited on surfaces of the pixel upper electrode and the pixel lower electrode respectively.

In this embodiment, a voltage waveform of the alternating electric field includes but is not limited to a sine wave, a triangle wave, a square wave, a pulse or a combination thereof. A voltage frequency of the alternating electric field ranges from 1 Hz to 1000M Hz.

In this embodiment, the μLED light-emitting and display device is manufactured on a rigid material including glass or ceramics, or manufactured on a flexible material including P1.

FIG. 1 illustrates a single light emitting unit (pixel) structure in this embodiment, wherein the μLED chip has a semiconductor junction with a single structure of P-type semiconductor layer—multi-quantum well—N-type semiconductor layer. The μLED3 is, for example, a GaN-based LED that is formed by an epitaxial method and includes an N-doped GaN layer 302, a P-doped GaN layer 301 and a multi-quantum well light emitting layer 303. A planar size of the μLED3 is 20 μm×20 μm.

The pixel lower electrode 101 and the pixel upper electrode 201 are made of indium tin oxide, and planar sizes of the pixel lower electrode 101 and pixel upper electrode 201 are 60 μm×60 μm.

The lower insulation layer 102 is 100 nm in thickness, and made of aluminum oxide.

The upper insulation layer 202 is 100 nm in thickness, and made of aluminum oxide.

When an AC signal is applied between the pixel upper electrode 201 and the pixel lower electrode 101, the μLED3 may emit light.

Figure 2:
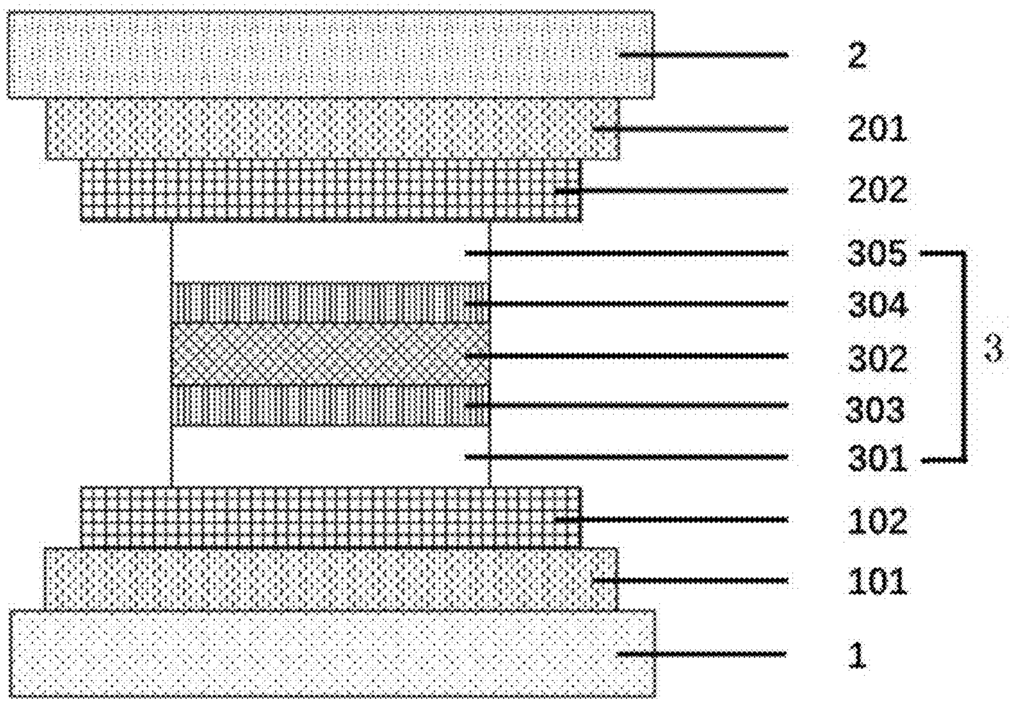
FIG. 2 is a sectional view of a light-emitting pixel in another μLED light-emitting and display device without electrical contact, external carrier injection and mass transfer according to an embodiment of the present invention.

FIG. 2 illustrates another single light emitting unit (pixel) structure in this embodiment, wherein the μLED chip has a compound semiconductor junction with a structure of P-type semiconductor material—multi-quantum well—N-type semiconductor material—multi-quantum well—P-type semiconductor material. The μLED3 is, for example, a GaN-based LED that is formed by an epitaxial method, has a semiconductor pair junction structure, and includes a P-doped GaN layer 305, an N-doped GaN layer 302, a P-doped GaN layer 301 and multi-quantum well light emitting layers 303 and 304. A planar size of the μLED3 is 20 μm×20 μm.

The pixel lower electrode 101 and pixel upper electrode 201 are made of indium tin oxide, and planar sizes of the pixel lower electrode 101 and pixel upper electrode 201 are 60 μm×60 μm.

The lower insulation layer 102 is 100 nm in thickness, and made of aluminum oxide.

The upper insulation layer 202 is 100 nm in thickness, and made of aluminum oxide.

When an AC signal is applied between the pixel upper electrode 201 and the pixel lower electrode 101, the μLED3 may emit light.

An embodiment of the present invention further provides a method for preparing the μLED light-emitting and display device without electrical contact, external carrier injection and mass transfer as described above. Specifically, the method includes the following steps.

In S1, a self-supporting μLED chip is obtained by growing an LED thin film structure that can generate a light source in three primary colors, i.e., red, green and blue on a surface of a semiconductor substrate and forming a μLED chip pattern with a desired size by cutting and peeling.

In S2, a lower electrode array of a sub-pixel having three primary colors, i.e., red, green and blue, a thin film transistor driving array, and an electrical connection line therebetween are prepared on the surface of the substrate according to size and definition requirements of a display.

In S3, non-electrical contact between the PLED chip and a corresponding sub-pixel lower electrode is realized through an insulation layer preparation process by disposing red, green and blue μLED chips on a surface of the lower electrode of the sub-pixel having three primary colors, i.e., red, green and blue correspondingly and respectively.

In S4, non-electrical contact between the μLED chip and a corresponding sub-pixel upper electrode is realized through the insulation layer preparation process by disposing a pixel upper electrode and an electrical connection line thereof on the surface of the substrate provided with red, green and blue μLED chips, so as to obtain a μLED light-emitting and display device without electrical contact, external carrier injection and mass transfer.

The operation of the μLED device is realized by applying an AC driving signal on the pixel upper electrode and the thin film transistor array.

In this embodiment, the substrate is a rigid material including glass or ceramics, or a flexible material including P1.

In this embodiment, in S3, the red, green and blue μLED chips are disposed at desired positions respectively in a manner of ink-jet printing, screen printing, spin coating, brush coating, roll coating, chemical self-assembly, or electromagnetic self-assembly.

In this embodiment, in S3, realizing the non-electrical contact between the μLED chip and the corresponding sub-pixel lower electrode through the insulation layer preparation process specifically includes: realizing the non-electrical contact between the μLED chip and a pixel lower electrode by firstly preparing an insulation layer on a surface of a pixel lower electrode array, and then disposing the μLED chip on a surface of the insulation layer.

Optionally, in S3, realizing the non-electrical contact between the μLED chip and the corresponding sub-pixel lower electrode through the insulation layer preparation process specifically includes: realizing the non-electrical contact between the μLED chip and a pixel lower electrode by wrapping an insulation layer on a surface of the μLED chip, and then preparing the μLED chip wrapped with the insulation layer on a surface of the pixel lower electrode.

In this embodiment, in S4, the pixel upper electrode and the electrical connection line thereof are prepared by lamination or growth.

In this embodiment, in S4, realizing the non-electrical contact between the μLED chip and the corresponding sub-pixel upper electrode through the insulation layer preparation process specifically includes: realizing the non-electrical contact between the μLED chip and the pixel upper electrode by firstly depositing an insulation layer on a surface of the μLED chip, and then preparing the pixel upper electrode on a surface of the insulation layer.

Optionally, in S4, realizing the non-electrical contact between the μLED chip and the corresponding sub-pixel upper electrode through the insulation layer preparation process specifically includes: realizing the non-electrical contact between the μLED chip and the pixel upper electrode by firstly preparing an insulation layer on a surface of the pixel upper electrode, and then manufacturing the upper electrode and the insulation layer on a surface of the μLED chip through a lamination technology.

Figure 3:
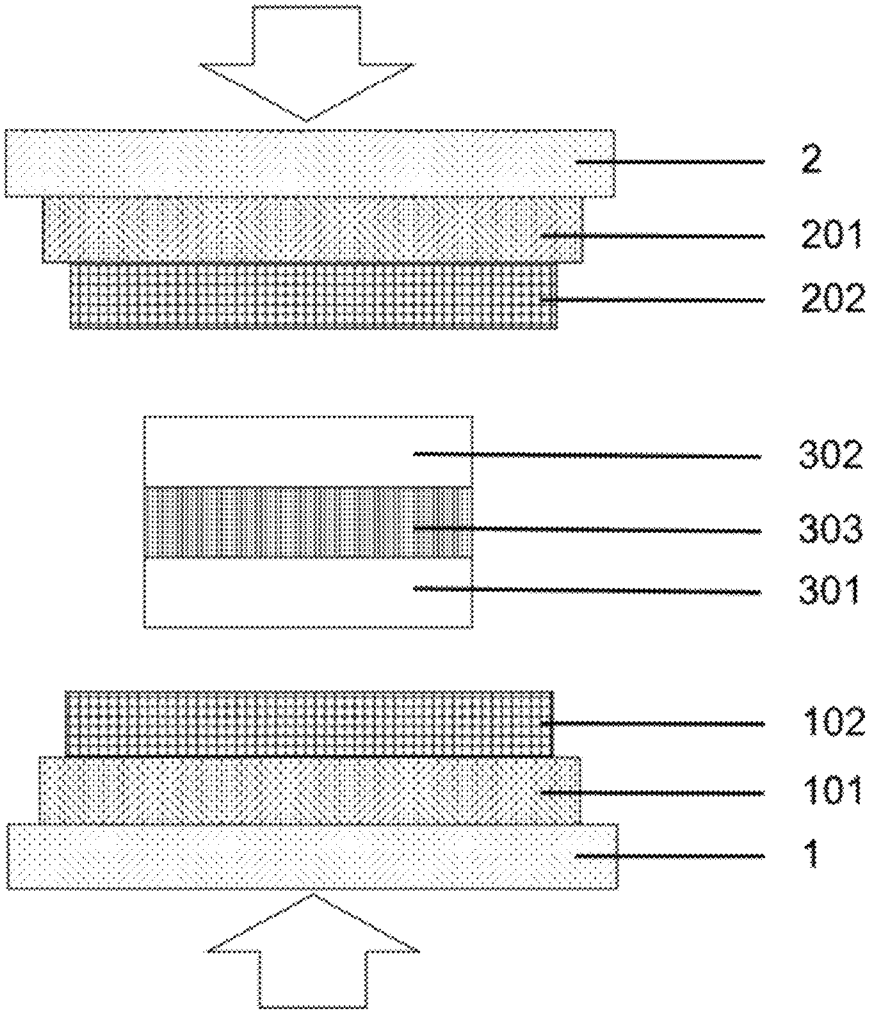
FIG. 3 illustrates a process of preparing the light-emitting pixel in FIG. 1.

Referring to FIG. 3, which illustrates a preparation method in FIG. 1. Specifically, the insulation layer 102 and the insulation layer 202 are firstly deposited on the surfaces of the pixel lower electrode 101 and the pixel upper electrode 201 through the following steps.

(1) The μLED3 is, for example, a GaN-based LED that is formed by an epitaxial method and includes an N-doped GaN layer 302, a P-doped GaN layer 301 and a multi-quantum well light emitting layer 303. The planar size of the μLED3 is 20 μm×20 μm.

Optionally, the μLED3 may also be a GaAs-based LED formed by the epitaxial method.

(2) The patterned lower electrode substrate 1 and upper electrode substrate 2 are cleaned and processed respectively. The lower electrode 101 and the upper electrode 201 are made of indium tin oxide, and the planar sizes of the pixel lower electrode 101 and pixel upper electrode 201 are 60 μm×60 μm.

Optionally, the lower electrode 101 and the upper electrode 201 may also be made of a metal material such as gold, silver, copper and aluminum.

(3) The insulation layer 102 is deposited on the surface of the lower electrode 101 by magnetron sputtering, and the thickness of the insulation layer 102 is 100 nm.

Optionally, the insulation layer 102 may be made of a high-K dielectric material such as aluminum oxide and hafnium oxide; the insulation layer 102 may also be deposited on the surface of the lower electrode 101 by atomic layer deposition, or the like.

(4) The insulation layer 202 is deposited on the surface of the upper electrode 201 by magnetron sputtering, and the thickness of the insulation layer 202 is 100 nm.

Optionally, the insulation layer 202 may be made of a high-K dielectric material such as aluminum oxide and hafnium oxide; the insulation layer 202 may also be deposited on the surface of the upper electrode 201 by atomic layer deposition, or the like.

(5) The μLED3 is transferred to the surface of the lower electrode substrate 1 through a μLED array preparation technology, such that the μLED3 is located on the surface of the insulation layer 102.

Optionally, the μLED array preparation technology includes ink-jet printing, screen printing, spin coating, brush coating, roll coating, chemical self-assembly, electromagnetic self-assembly, and the like.

(6) The upper electrode substrate 2 is assembled on the lower electrode substrate 1, such that the μLED3 is located between the insulation layer 102 and the insulation layer 202. When an AC signal is applied between the upper electrode 201 and the lower electrode 101, the μLED3 may emit light.

Figure 4:
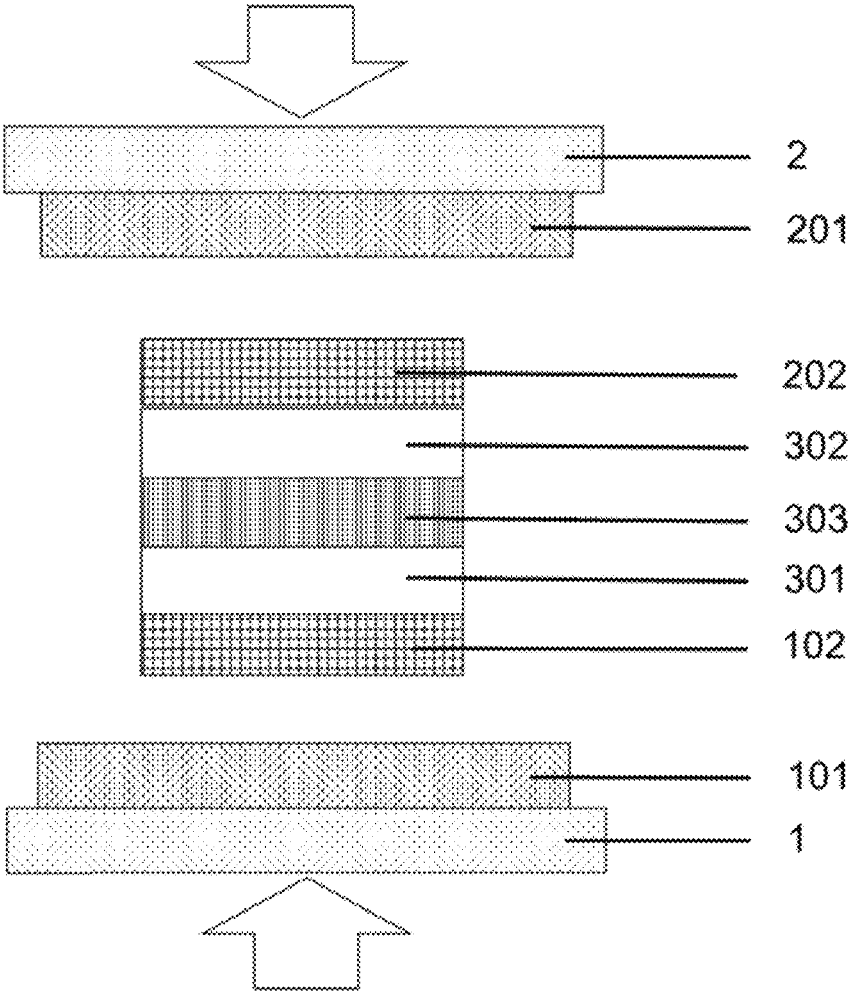
FIG. 4 illustrates another process of preparing the light-emitting pixel in FIG. 1.

Referring to FIG. 4, which illustrates another preparation method in FIG. 1. Specifically, the insulation layer 102 and the insulation layer 202 are firstly deposited on the surfaces of μLED chips 301 and 302 through the following steps.

(1) The μLED3 is, for example, a GaN-based LED that is formed by an epitaxial method and includes an N-doped GaN layer 302, a P-doped GaN layer 301 and a multi-quantum well light emitting layer 303. A self-supporting μLED chip is obtained by peeling. The planar size of the μLED3 is 20 μm×20 μm.

Optionally, the μLED3 may also be a GaAs-based LED formed by the epitaxial method.

(2) The patterned lower electrode substrate 1 and upper electrode substrate 2 are cleaned and processed respectively. The lower electrode 101 and the upper electrode 201 are made of indium tin oxide, and the planar sizes of the lower electrode 101 and the upper electrode 201 are 60 μm-60 μm.

Optionally, the lower electrode 101 and the upper electrode 201 may also be made of a metal material such as gold, silver, copper and aluminum.

(3) The insulation layer 102 is deposited on a lower surface of the μLED3 by atomic layer deposition, and the thickness of the insulation layer 102 is 100 nm.

(4) The insulation layer 202 is deposited on an upper surface of the μLED3 by atomic layer deposition, and the thickness of the insulation layer 202 is 100 nm.

Optionally, the insulation layer 102 and the insulation layer 202 may be made of a high-K dielectric material such as aluminum oxide and hafnium oxide.

(5) The μLED3 is transferred to the surface of the lower electrode substrate 1 through a PLED array preparation technology, such that the μLED3 is located on the surface of the insulation layer 102.

Optionally, the μLED array preparation technology includes ink-jet printing, screen printing, spin coating, brush coating, roll coating, chemical self-assembly, electromagnetic self-assembly, and the like.

(6) The upper electrode substrate 2 is assembled on the surface of the lower electrode substrate 1, such that the μLED3 on which the insulation layer 102 and the insulation layer 202 are deposited is located between the upper electrode 201 and the lower electrode 101.

Figure 5:
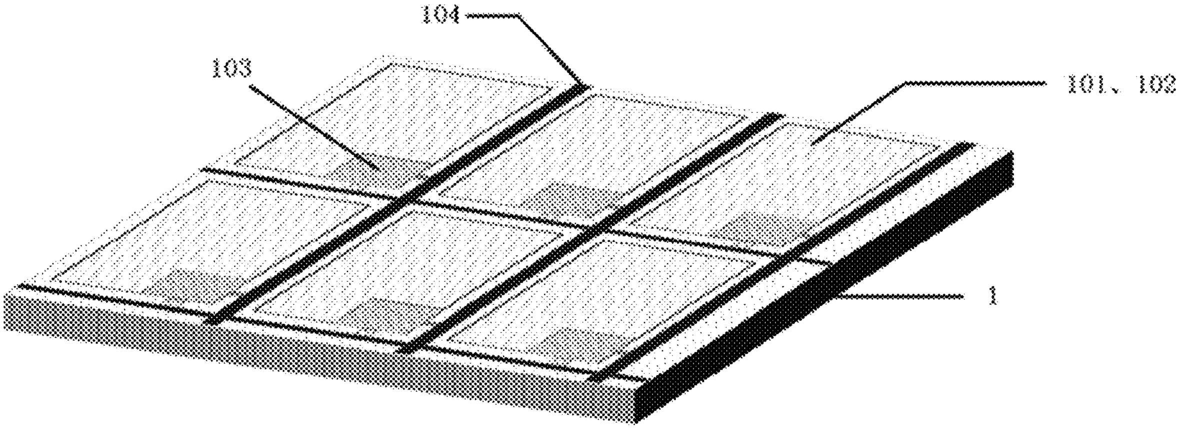
FIG. 5 to FIG. 7 illustrate a process of preparing a μLED light-emitting and display device without electrical contact, external carrier injection and mass transfer with the light-emitting pixel in FIG. 1.
Figure 6:
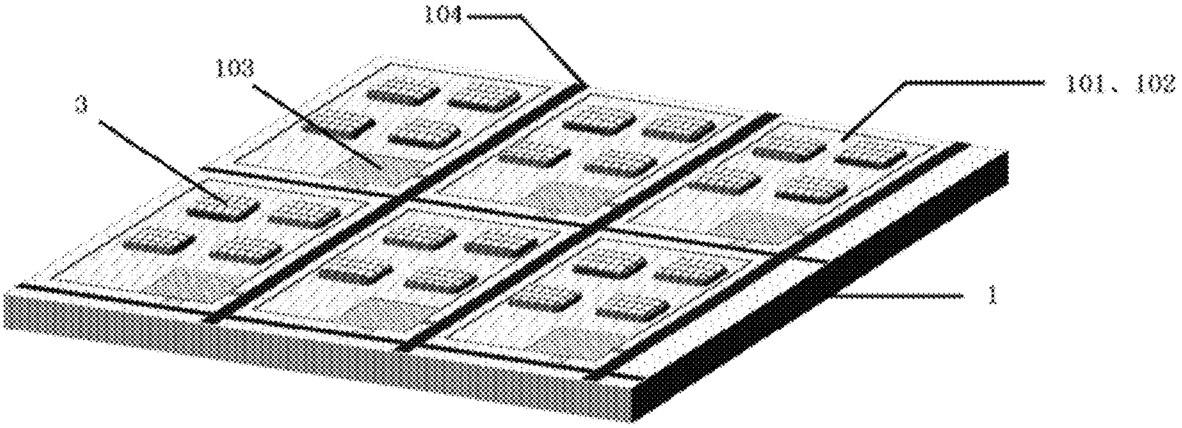
Figure 7:
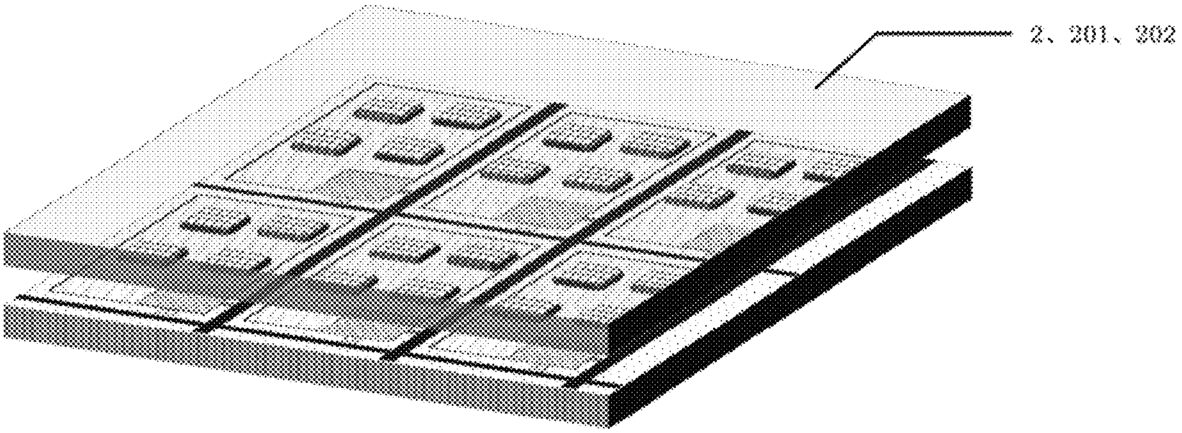

FIG. 5 to FIG. 7 illustrate a method for preparing a μLED light-emitting and display device without electrical contact, external carrier injection and mass transfer in this embodiment. The μLED device includes one or more light-emitting pixels, and the method includes the following steps.

(1) The μLED3 is, for example, a GaN-based LED that is formed by an epitaxial method and includes an N-doped GaN layer 302, a P-doped GaN layer 301 and a multi-quantum well light emitting layer 303. A self-supporting PLED chip is obtained by peeling. The planar size of the μLED3 is 20 μm-20 μm.

Optionally, the μLED3 may also be a GaAs-based LED formed by the epitaxial method.

(2) As shown in FIG. 5, a patterned indium tin oxide (ITO) pixel array 101, a thin film transistor array 103 and an electrode connection line array 104 thereof are prepared on the surface of the lower substrate 1 through the conventional processes of preparing the patterned ITO electrode, the thin film transistor array and the electrode connection line. A size of the IT) pixel electrode 101 is 60 μm×60 μm.

(3) The insulation layer 102 is deposited on a surface of the ITO pixel array 101 by atomic layer deposition, and the thickness of the insulation layer 102 is 100 nm.

Optionally, the insulation layer 102 and the insulation layer 202 may be made of a high-K dielectric material such as aluminum oxide and hafnium oxide.

(4) As shown in FIG. 6, the μLED3 is transferred to the surface of the lower electrode substrate 1 through a μLED array preparation technology, such that the μLED3 is located on the surface of the insulation layer 102.

Optionally, the μLED array preparation technology includes ink-jet printing, screen printing, spin coating, brush coating, roll coating, chemical self-assembly, electromagnetic self-assembly, and the like.

(5) The insulation layer 202 is deposited on the surface of the upper substrate electrode 201 by atomic layer deposition, and the thickness of the insulation layer 202 is 100 nm.

(6) As shown in FIG. 7, the upper electrode substrate 2 and the lower electrode substrate 1 are assembled, such that the μLED3 is located between the insulation layer 102 and the insulation layer 202. When an AC signal is applied between the upper electrode 201 and the lower electrode 101, the μLED3 may emit light.

The foregoing descriptions are merely preferred embodiments of the present invention but are not intended to limit the present disclosure in other forms. Any person skilled in the art may change or modify the technical content disclosed above into equivalent embodiments with equivalent changes. However, any simple modifications, equivalent changes and variations made to the above embodiments without departing from the content of the technical solution of the present invention based on the technical essence of the present invention shall be encompassed in the scope of protection of the present invention.

What is claimed is:

1. A method for manufacturing a micro light emitting diode (μLED) light-emitting and display device without electrical contact, external carrier injection and mass transfer, comprising the following steps:

in Step1, obtaining a self-supporting μLED chip which comprises a P-type semiconductor layer, a light emitting layer and an N-type semiconductor layer stacked to form a light-emitting semiconductor junction, wherein the μLED chip is obtained by growing an LED thin film structure capable of generating a light source in three primary colors red, green, and blue on a surface of a semiconductor substrate and forming a μLED chip pattern with a desired size by cutting and peeling;

in Step2, preparing a lower electrode array of a sub-pixel having three primary colors red, green, and blue, a thin film transistor driving array, and an electrical connection line therebetween on the surface of the substrate;

in Step3, realizing non-electrical contact between the μLED chip and a corresponding sub-pixel lower electrode through an insulation layer preparation process by disposing red, green and blue μLED chips on a surface of a lower electrode of the sub-pixel having three primary colors red, green, and blue correspondingly and respectively; and in Step4, realizing non-electrical contact between the μLED chip and a corresponding sub-pixel upper electrode through the insulation layer preparation process by disposing a pixel upper electrode and an electrical connection line thereof on the surface of the substrate provided with red, green and blue μLED chips, so as to obtain the μLED light-emitting and display device without electrical contact, external carrier injection and mass transfer.

2. The method according to claim 1, wherein in Step3, the red, green and blue μLED chips are disposed at desired positions respectively in a manner of ink-jet printing, screen printing, spin coating, brush coating, roll coating, chemical self-assembly, or electromagnetic self-assembly.

3. The method according to claim 1, wherein in Step3, realizing the non-electrical contact between the μLED chip and the corresponding sub-pixel lower electrode through the insulation layer preparation process specifically comprises: realizing the non-electrical contact between the μLED chip and a pixel lower electrode by firstly preparing an insulation layer on a surface of a pixel lower electrode array, and then disposing the μLED chip on a surface of the insulation layer.

4. The method according to claim 1, wherein in Step3, realizing the non-electrical contact between the μLED chip and the corresponding sub-pixel lower electrode through the insulation layer preparation process specifically comprises: realizing the non-electrical contact between the μLED chip and a pixel lower electrode by wrapping an insulation layer on a surface of the μLED chip, and then preparing the μLED chip wrapped with the insulation layer on a surface of the pixel lower electrode.

5. The method according to claim 1, wherein in Step4, the pixel upper electrode and the electrical connection line thereof are prepared by lamination or growth.

6. The method according to claim 1, wherein in Step4, realizing the non-electrical contact between the μLED chip and the corresponding sub-pixel upper electrode through the insulation layer preparation process specifically comprises: realizing the non-electrical contact between the μLED chip and the pixel upper electrode by firstly depositing an insulation layer on a surface of the μLED chip, and then preparing the pixel upper electrode on a surface of the insulation layer.

7. The method according to claim 1, wherein in Step4, realizing the non-electrical contact between the μLED chip and the corresponding sub-pixel upper electrode through the insulation layer preparation process specifically comprises: realizing the non-electrical contact between the μLED chip and the pixel upper electrode by firstly preparing an insulation layer on a surface of the pixel upper electrode, and then manufacturing the upper electrode and the insulation layer on a surface of the μLED chip through a lamination technology.

* * * * *